(12) United States Patent
Trimberger

(10) Patent No.: US 7,392,500 B1
(45) Date of Patent: Jun. 24, 2008

(54) STRUCTURES AND METHODS FOR REDUCING POWER CONSUMPTION IN PROGRAMMABLE LOGIC DEVICES

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 479 days.

(21) Appl. No.: 11/235,997

(22) Filed: Sep. 27, 2005

Related U.S. Application Data

(62) Division of application No. 10/737,603, filed on Dec. 16, 2003, now Pat. No. 6,980,026.

(51) Int. Cl.
G06F 17/50 (2006.01)
H03K 17/693 (2006.01)

(52) U.S. Cl. .......................................... 716/16; 716/17

(58) Field of Classification Search .................. 716/16, 716/17
See application file for complete search history.

(56) References Cited

U.S. PATENT DOCUMENTS

| | | | |
|---|---|---|---|
| 5,598,109 A | | 1/1997 | Leong et al. |
| 5,649,124 A | * | 7/1997 | Kreidl .......................... 710/305 |
| 5,701,441 A | | 12/1997 | Trimberger |
| 5,978,260 A | * | 11/1999 | Trimberger et al. ......... 365/182 |
| 6,249,144 B1 | | 6/2001 | Agrawal et al. |
| 6,799,304 B2 | * | 9/2004 | Hammitt et al. ................. 716/1 |
| 7,188,266 B1 | * | 3/2007 | Mendel et al. ............... 713/320 |
| 2003/0172363 A1 | * | 9/2003 | Chauhan et al. ............... 716/16 |
| 2005/0102642 A1 | * | 5/2005 | Tschanz et al. ................. 716/6 |

OTHER PUBLICATIONS

Xilinx, Inc.., Virtex-II Platform FPGA Handbook, Dec. 6, 2000, available from Xilinx, Inc., 2100 Logic Drive, San Jose, California 95124; pp. 46-54.

* cited by examiner

Primary Examiner—Jack Chiang
Assistant Examiner—Magid Y Dimyan
(74) Attorney, Agent, or Firm—Lois D. Cartier

(57) ABSTRACT

Structures and methods that can be used to reduce power consumption in programmable logic devices (PLDs). Varying delays on the input paths of a PLD lookup table (LUT) can cause the nodes within the LUT (including the LUT output signal) to change state several times each time the input signals change state. Therefore, a programmable logic block for a PLD is provided that registers the LUT input signals instead of, or in addition to, the LUT output signal. The delays on the input paths are equalized and "glitching" on the LUT nodes is greatly reduced or eliminated. Thus, power consumption is reduced. Methods are also provided of reducing power consumption in PLDs by replacing single-bit registers on LUT output signals with multi-bit registers on LUT input signals, or by including multi-bit input registers in addition to the single-bit output registers.

14 Claims, 7 Drawing Sheets

US 7,392,500 B1

STRUCTURES AND METHODS FOR REDUCING POWER CONSUMPTION IN PROGRAMMABLE LOGIC DEVICES

FIELD OF THE INVENTION

The invention relates to programmable logic devices (PLDs). More particularly, the invention relates to architectures and methods designed to reduce power consumption in PLDs by adding seemingly redundant memory elements to the logic blocks.

BACKGROUND OF THE INVENTION

Programmable logic devices (PLDs) are a well-known type of integrated circuit that can be programmed to perform specified logic functions. PLDs include, for example, field programmable gate arrays (FPGAs), complex programmable logic devices (CPLDs), mask programmable devices such as Application Specific ICs (ASICs), fuse and antifuse devices, and devices in which only a portion of the logic is programmable.

One type of PLD, the FPGA, typically includes an array of configurable logic blocks (CLBs) and programmable input/output blocks (IOBs). The CLBs and IOBs are interconnected by a programmable interconnect structure. Some FPGAs also include additional logic blocks with special purposes, e.g., DLLs, RAM, processors, and so forth. The interconnect structure, CLBs, IOBs, and other logic blocks are typically programmed by loading a stream of configuration data (bitstream) into internal configuration memory cells that define how the logic blocks and interconnect are configured. The configuration data can be read from memory (e.g., an external PROM) or written into the FPGA by an external device. The collective states of the individual memory cells then determine the function of the FPGA.

FIG. 1 is a simplified illustration of an exemplary FPGA. The FPGA of FIG. 1 includes an array of configurable logic blocks (LBs 101a-101i) and programmable IOBs (I/Os 102a-102d). The LBs and I/O blocks are interconnected by a programmable interconnect structure that includes a large number of interconnect lines 103 interconnected by programmable interconnect points (PIPs 104, shown as small circles in FIG. 1). PIPs are often coupled into groups (e.g., group 105) that implement multiplexer circuits selecting one of several interconnect lines to provide a signal to a destination interconnect line or logic block.

FIG. 2 illustrates a configurable logic block (CLB) for one type of FPGA, the Virtex®-II FPGA from Xilinx, Inc. The Xilinx Virtex-II CLB is further described in pages 46-54 of the "Virtex-II Platform FPGA Handbook", published December, 2000, available from Xilinx, Inc., 2100 Logic Drive, San Jose, Calif. 95124, which pages are incorporated herein by reference. (Xilinx, Inc., owner of the copyright, has no objection to copying these pages, but otherwise reserves all copyright rights whatsoever.)

CLB 200 of FIG. 2 includes four similar slices SLICE_0-SLICE_3. Each slice includes two lookup tables (LUTs) 201 and 202, a write strobe generator circuit 205, two carry multiplexers CM1 and CM2, two additional multiplexers MUX1 and MUX2, and two output memory elements 203 and 204.

Each LUT 201, 202 can function in any of several modes. When in lookup table mode, each LUT has four data input signals IN1-IN4 that are supplied by the FPGA interconnect structure (not shown) via input multiplexers (not shown). (In the present specification, the same reference characters are used to refer to terminals, signal lines, and their corresponding signals.) When in RAM mode, input data is supplied by an input terminal RAM_DI_1, RAM_DI_2 to the DI terminal of the associated LUT. RAM write operations in both LUTs are controlled write strobe generator circuit 205, which supplies a write strobe signal WS to both LUTs based on RAM control signals provided by the interconnect structure.

Each LUT 201, 202 provides two output signals. A first output signal OUT1 is provided to an associated multiplexer MUX1, MUX2, which selects between the LUT output signal and an associated register direct input signal Reg_DI_1, Reg_DI_2 from the interconnect structure. Thus, each LUT can be optionally bypassed. The output of each multiplexer MUX1, MUX2 is provided to the data input terminal D of an associated output memory element (203, 204 respectively). Memory elements 203 and 204 are clocked by a clock signal CK (e.g., provided by a global clock network) and controlled by various other register control signals (e.g., from the interconnect structure or provided by configuration memory cells of the FPGA). Each memory element 203, 204 provides a registered output signal Q1, Q2. The output of each LUT 201, 202 is also provided to an output terminal D1, D2 of the CLB. Thus, each output memory element can be optionally bypassed. The Virtex-II slice also includes output multiplexers (not shown) that select from among the various output signals of the slice and provide the selected signals to the FPGA interconnect structure.

The second output signal from each LUT 201, 202 controls an associated carry multiplexer CM1, CM2. The carry multiplexers form part of a vertical carry chain that traverses the slice from a carry in terminal CIN to a carry out terminal COUT.

FIG. 3 provides a simplified illustration of a typical logic block in a PLD. The logic block includes four input multiplexers IA-ID, a 4-input lookup table (LUT), an output memory element ME, and an output multiplexer OM controlled by a configuration memory cell MO. Each of input multiplexers IA-ID optionally selects one input signal from those available in the interconnect structure. Input multiplexers IA-ID are typically controlled by configuration memory cells (not shown). Input multiplexers IA-ID provide the data input signals A-D, respectively, to the LUT, which in turn provides a LUT output signal O to output memory element ME and output multiplexer OM. Output memory element ME is clocked by clock signal CK and provides registered signal Q to output multiplexer OM. Under the control of configuration memory cell MO, output multiplexer OM provides one of signals O and Q to the logic block output terminal OUT, and hence to the PLD interconnect structure.

Power consumption is an increasingly important consideration in integrated circuits (ICs), including PLDs. The circuit shown in FIG. 3 is widely used in PLDs. Therefore, it would clearly be desirable to provide a different circuit that can perform at least the same functions while consuming less power.

SUMMARY OF THE INVENTION

The invention provides structures that can be used to reduce power consumption in PLDs. Known PLDs include registers on the output terminals of lookup tables (LUTs). However, the nodes within a LUT (including the LUT output signal) can potentially change state several times each time the input signals change state, due to varying delays on the input paths preceding the LUT. Therefore, the invention provides a programmable logic block having registered input signals instead of, or in addition to, a registered output signal. User circuits that typically register a combinational output signal can be modified to register all of the data input signals to the combinational logic. The clock-to-out delay is increased because of the delay through the LUT, but the delays on the input paths are equalized and "glitching" on the LUT nodes is greatly reduced or eliminated.

The invention also provides methods of modifying user circuits in PLDs to reduce power consumption. Sub-circuits are identified within the user circuit that include both combinational logic and a single-bit register, where the combinational logic precedes the single-bit register and provides a single output signal to the register. These sub-circuits are replaced by new sub-circuits that include multi-bit registers on the input signals to the combinational logic. In some of these embodiments, the new sub-circuits also include single-bit registers on the output signals from the combinational logic. In other embodiments, the multi-bit registers on the input signals replace the single-bit registers on the output signals.

The invention also provides media that store code for performing the methods of the invention, and computer systems for executing these methods.

BRIEF DESCRIPTION OF THE DRAWINGS

The present invention is illustrated by way of example, and not by way of limitation, in the following figures.

DETAILED DESCRIPTION OF THE DRAWINGS

The present invention is believed to be applicable to a variety of programmable logic devices (PLDs). The present invention has been found to be particularly applicable and beneficial for field programmable gate arrays (FPGAs). However, the present invention is not so limited.

Figure 1:
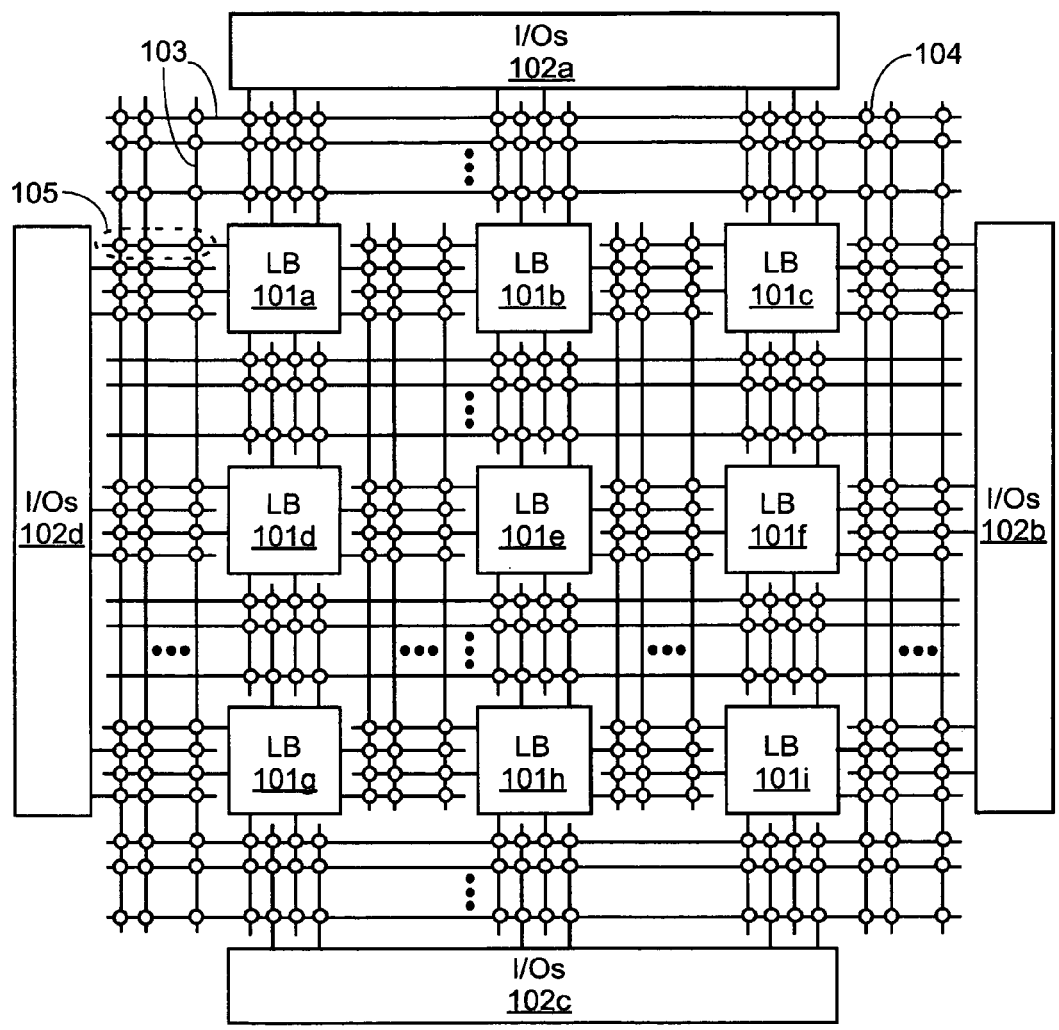
FIG. 1 is a simplified architectural representation of a well-known field programmable gate array (FPGA).
Figure 2:
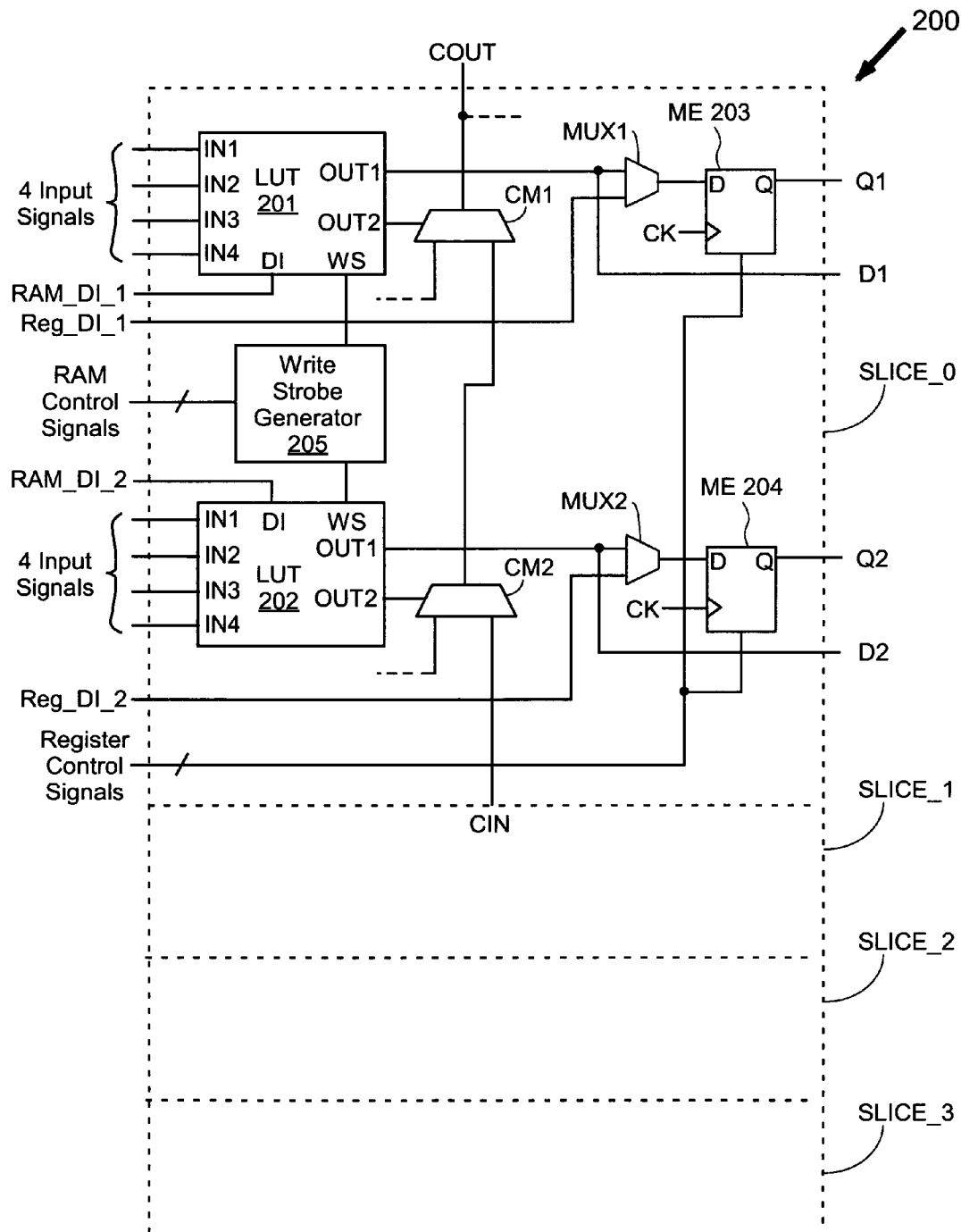
FIG. 2 is a block diagram of a configurable logic block (CLB) in a Virtex-II FPGA.
Figure 3:
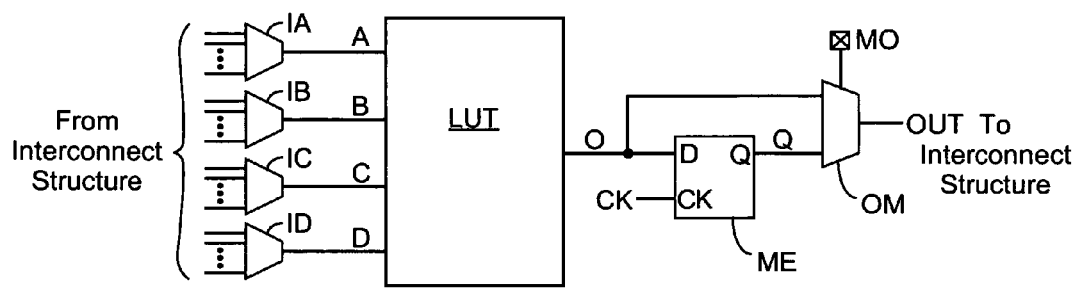
FIG. 3 is a block diagram of a typical logic block in a programmable logic device (PLD).
Figure 4:
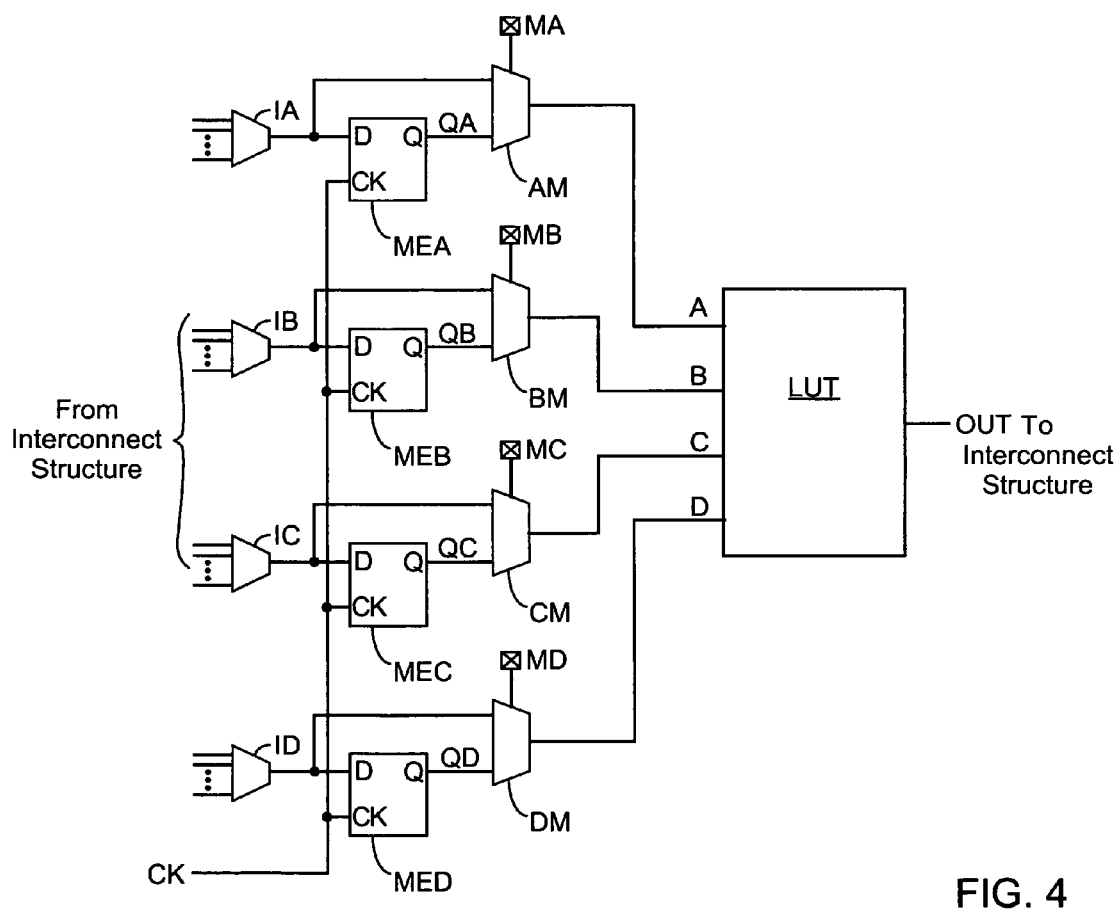
FIG. 4 is a block diagram of a first logic block in a PLD according to an embodiment of the invention.

FIG. 4 illustrates a logic block implemented according to one embodiment of the present invention. The circuit of FIG. 4 can be included, for example, in a configurable logic block (CLB) in an FPGA. In some embodiments, the circuit of FIG. 4 is substituted for the circuit of FIG. 3 in an FPGA otherwise similar to well-known FPGAs such as the Virtex-II FPGA from Xilinx, Inc.

The circuit of FIG. 4 includes four input multiplexers IA-ID, four input memory elements MEA-MED, four LUT multiplexers AM-DM, four memory cells MA-MD, and a 4-input lookup table LUT. Each of input multiplexers IA-ID optionally selects one input signal from those available in the interconnect structure. Input multiplexers IA-ID each provide a selected data input signal to the data input terminal of an associated input memory element MEA-MED and also to one input terminal of an associated LUT multiplexer AM-DM, respectively. Input memory elements MEA-MED are all clocked by the same clock signal CK, and each provides a registered input signal QA-QD to the associated LUT multiplexer AM-DM, respectively. LUT multiplexers AM-DM each select between the signal provided by the associated input multiplexer IA-ID and the registered signal QA-QD from the associated input memory element MEA-MED, respectively. LUT multiplexers AM-DM are controlled by configuration memory cells MA-MD, respectively. Each LUT multiplexer AM-DM provides one of the data input signals A-D, respectively, to the LUT. The LUT, in turn, provides an output signal OUT to the interconnect structure of the PLD.

Note that the circuits shown in FIGS. 3 and 4 are logically equivalent. A user sub-circuit implemented as shown in FIG. 3 can be replaced by the circuit of FIG. 4 with no change in functionality. However, the timing of the circuit will be different, because the delay through the LUT has been added to the clock-to-out delay, while the setup time for memory elements MEA-MED (FIG. 4) is less than that of memory element ME (FIG. 3). (The clock-to-out delay is the amount of time that elapses between an active edge on clock signal CK and a change of state on output terminal OUT. The setup time is the time required for the data to be present before the active edge on the clock signal CK.)

Note also that the circuit of FIG. 4 includes a larger number of memory elements, multiplexers, and memory cells than the circuit of FIG. 3, and therefore consumes a larger die area. Hence, in the absence of a suggested motivation to use the larger circuit, the circuit of FIG. 3 is likely to be preferred to the circuit of FIG. 4. The present invention provides such a motivation.

Signals routed through a PLD interconnect structure can have widely varying delays, depending on the distance traveled by the signals, the number of signal destinations (loads), the number and type of programmable elements traversed by the signal paths, and so forth. Therefore, a user circuit implemented in the circuit of FIG. 3 can include, for example, a LUT having four data input signals A-D that arrive at varying times. Hence, whenever more than one of the input signals A-D changes state in a single clock cycle, glitching (temporary and undesirable changes of state) can occur on nodes within the LUT, and on the LUT output signal O. Glitching can also potentially occur on the output signal OUT from the logic block, which can be buffered and might be heavily loaded. In extreme cases, glitching might even occur in destination LUTs driven by the output signal OUT. Because electronic circuits typically consume power whenever signals change state, any glitching adds to the power consumption of the PLD.

The circuit of FIG. 4 does not display this glitching behavior, and therefore provides reduced power consumption compared to the circuit of FIG. 3. In the circuit of FIG. 4, all four data input signals from the interconnect structure are optionally registered by memory elements MEA-MED. Therefore, the data signals A-D received by the LUT all change state at the same time, and glitches do not occur.

In another embodiment (not shown), LUT multiplexers AM-DM and memory cells MA-MD are omitted. In other words, the output terminals QA-QD of input memory elements MEA-MED are coupled directly to the data input terminals A-D of the LUT. In this embodiment, the input signals from the interconnect structure are always registered prior to providing the signals to the LUT.

Figure 5:
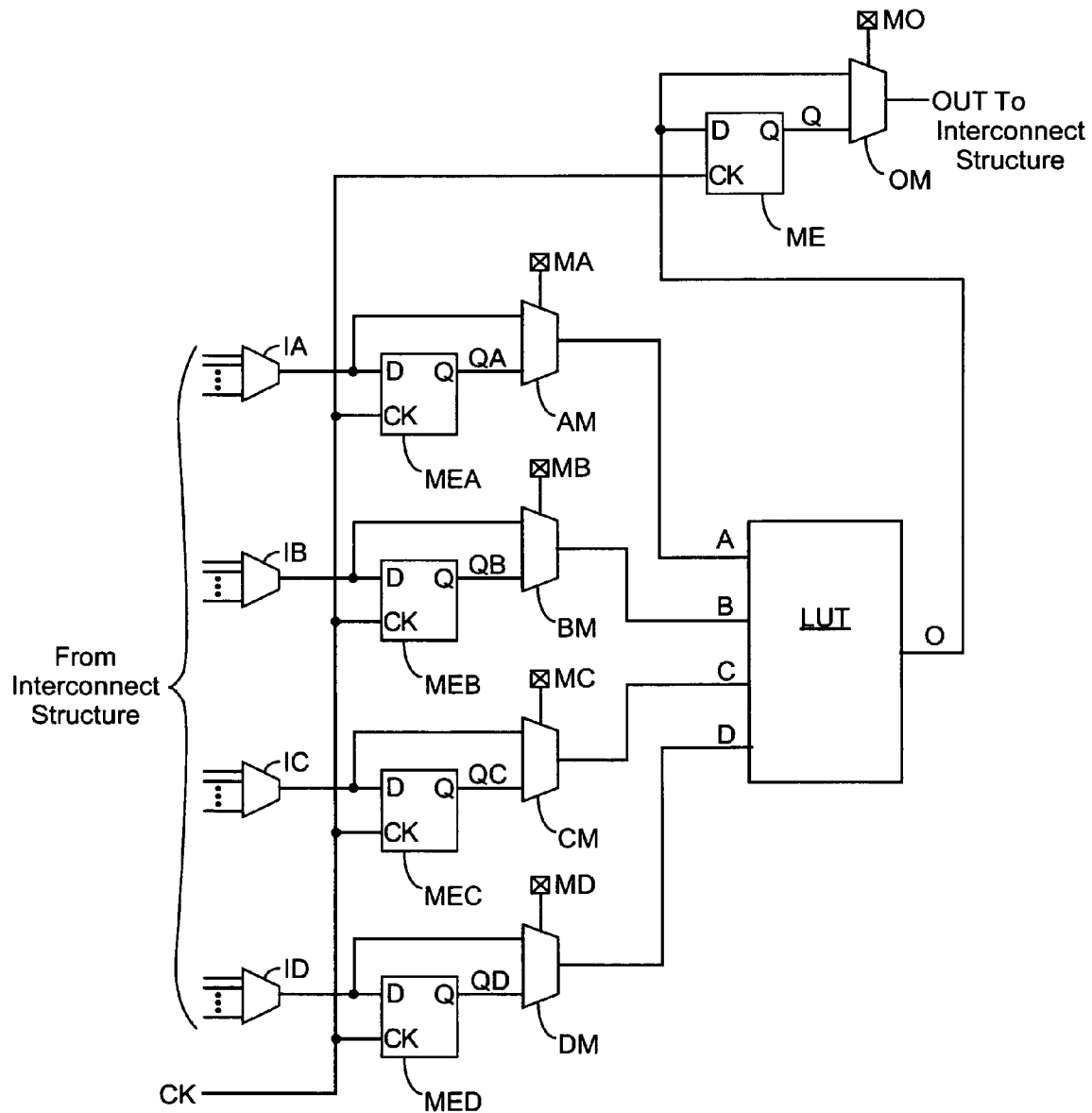
FIG. 5 is a block diagram of a second logic block in a PLD according to an embodiment of the invention.

FIG. 5 illustrates another logic block that can be used to implement the invention. In the circuit of FIG. 5, the output memory element ME, output multiplexer OM, and memory cell MO of FIG. 3 are all included. In addition, input memory elements MEA-MED, LUT multiplexers AM-DM, and memory cells MA-MD similar to those of FIG. 4 are included in the logic block. Because the circuit of FIG. 5 includes all of the elements from FIG. 4, the circuit of FIG. 5 can also be used to substitute a multi-bit register on the LUT input signals for a single-bit register on the output signal for the logic block, when a low-power implementation of a user circuit is desired. However, other options are also available for the implementation of user circuits.

For example, the input memory elements and the output memory element can all be used to implement a user circuit. This option is particularly helpful when implementing a heavily pipe-lined user circuit.

As another example, after placing the combinational logic from the user circuit into appropriate LUTs, a choice could be made for each logic block between the multi-bit input register and the single-bit output register. The choice between the registers could be made, for example, based on which selection would most nearly equalize the delays between registers for the various signal paths included in the user circuit. In this scenario, the multi-bit input register is used (with the consequent reduction in power consumption) only when the increased clock-to-out delay associated with this implementation does not slow down the overall performance of the user circuit as implemented in the PLD.

Note that the circuit shown in FIG. 5 can be made logically equivalent to the circuits of FIGS. 3 and 4, if only one of the input and output registers is used in a given logic block and the other register is bypassed.

Figure 6:
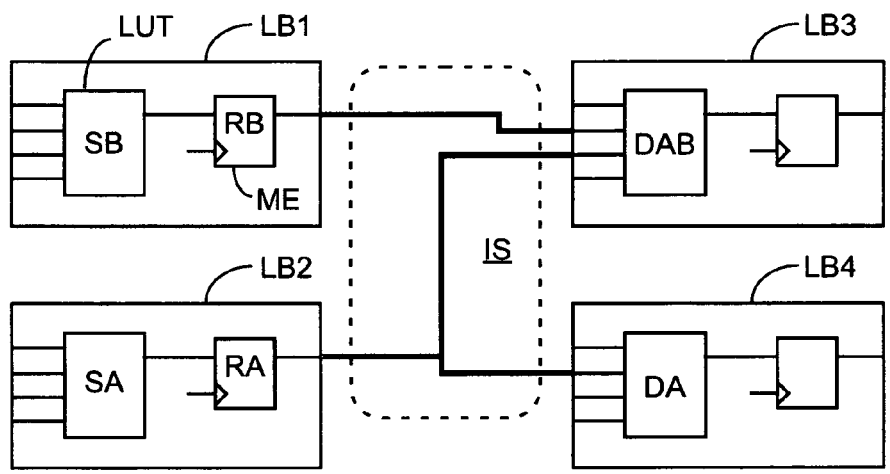
FIG. 6 illustrates how an exemplary user circuit can be implemented in a PLD that includes the logic block shown in FIG. 3.

FIG. 6 illustrates how an exemplary user circuit can be implemented in a PLD that includes the logic block shown in FIG. 3. Each logic block LB1-LB4 in FIG. 6 includes a lookup table LUT followed by a memory element ME. The exemplary user circuit includes two combinational source circuits SA, SB, each driving a single-bit register RA, RB, respectively. Source circuits SA, SB are each implemented in a single LUT, circuit SA being implemented in logic block LB2 and circuit SB being implemented in logic block LB1. The LUT including circuit SA drives a register RA implemented in the output memory element of the same logic block LB2. The LUT including circuit SB drives a register RB implemented in the output memory element of the same logic block LB1.

Combinational destination circuit DAB is implemented in the LUT of logic block LB3, and is driven by registers RB and RA. Combinational destination circuit DA is implemented in the LUT of logic block LB4, and is driven by register RA. The connections between the registers RA, RB and the destination circuits DA, DAB are routed through the interconnect structure IS of the programmable logic device.

Figure 7:
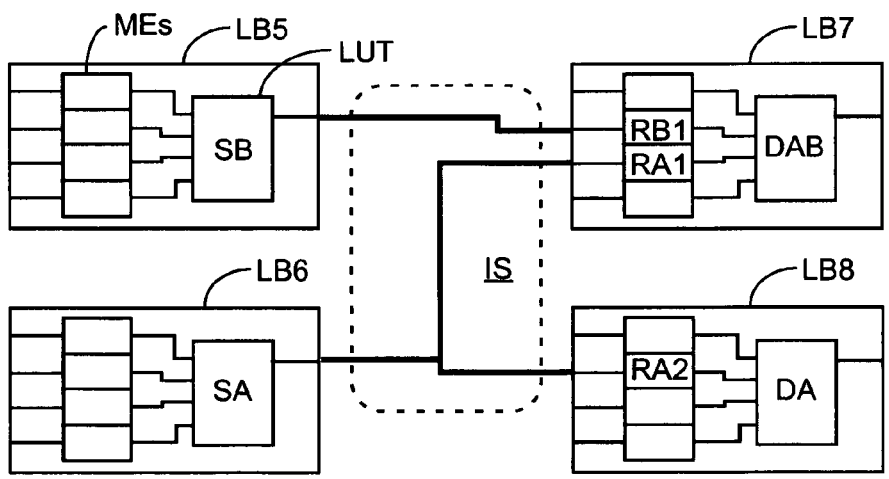
FIG. 7 illustrates a first way in which the exemplary user circuit of FIG. 6 can be implemented in a PLD that includes the logic block shown in FIG. 4.

FIG. 7 illustrates one way in which the exemplary user circuit of FIG. 6 can be implemented in a PLD logic block that includes a multi-bit input register instead of a single-bit output register. Each logic block LB5-LB8 in FIG. 7 includes a multi-bit register MEs (i.e., a plurality of memory elements) followed by a lookup table LUT. Source circuits SA, SB are again each implemented in a single LUT, which can be the same, for example, as the LUT in FIG. 6. Circuit SA is implemented in the LUT in logic block LB6 and circuit SB is implemented in the LUT in logic block LB5. Destination circuits DA and DAB are implemented in the LUTs in logic blocks LB8 and LB7, respectively.

However, register RB is not included in logic block LB5 with source circuit SB. Instead, register RB1 is implemented using an input memory element in the same logic block LB7 as the destination logic DAB. Similarly, register RA is implemented as two input memory elements RA1 and RA2, each one being included in the same logic block as the associated destination circuit (RA1 with RB1 and DAB in logic block LB7, and RA2 with DA in logic block LB8).

The connections between the source logic SA, SB and registers RA1, RA2, and RB1 are routed through the interconnect structure IS of the programmable logic device.

Note that the implementation of FIG. 7 is logically equivalent to the implementation of FIG. 6, although the path delays may vary because of the difference in the clock-to-out delay.

Figure 8:
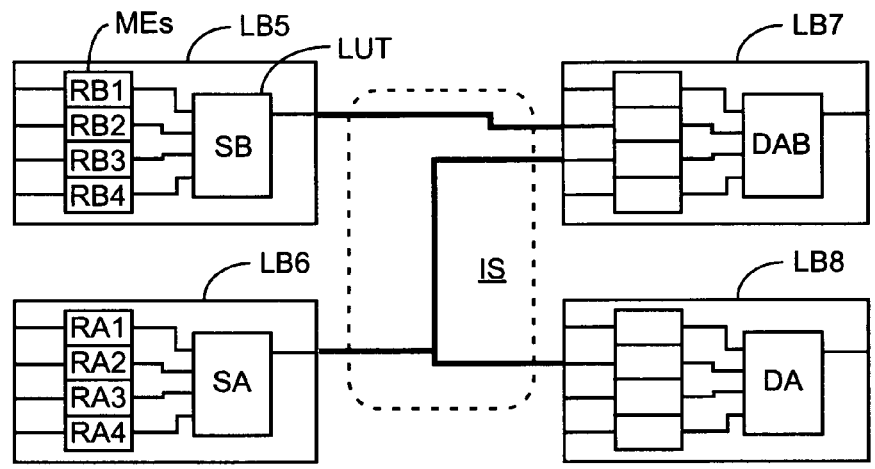
FIG. 8 illustrates a second way in which the exemplary user circuit of FIG. 6 can be implemented in a PLD that includes the logic block shown in FIG. 4.

FIG. 8 illustrates another way in which the exemplary user circuit of FIG. 6 can be implemented in a PLD logic block that includes a multi-bit input register instead of a single-bit output register. In the embodiment of FIG. 8, the source logic and the register within each logic block LB5-LB8 remain in the same logic block as in FIG. 6. Circuit SA is implemented in the LUT in logic block LB6 and circuit SB is implemented in the LUT in logic block LB5. However, the single-bit register at the output of the LUT (see FIG. 6) is replaced by a multi-bit register at the inputs to the LUT (see FIG. 8). Thus, register RA is implemented as four input memory elements RA1-RA4 included in the same logic block LB6 as source circuit SA. Similarly, register RB is implemented as four input memory elements RB1-RB4 included in the same logic block LB5 as source circuit SB.

Note that the implementation of FIG. 8 is logically equivalent to the implementations of FIGS. 6 and 7, although the path delays may vary.

Figure 9:
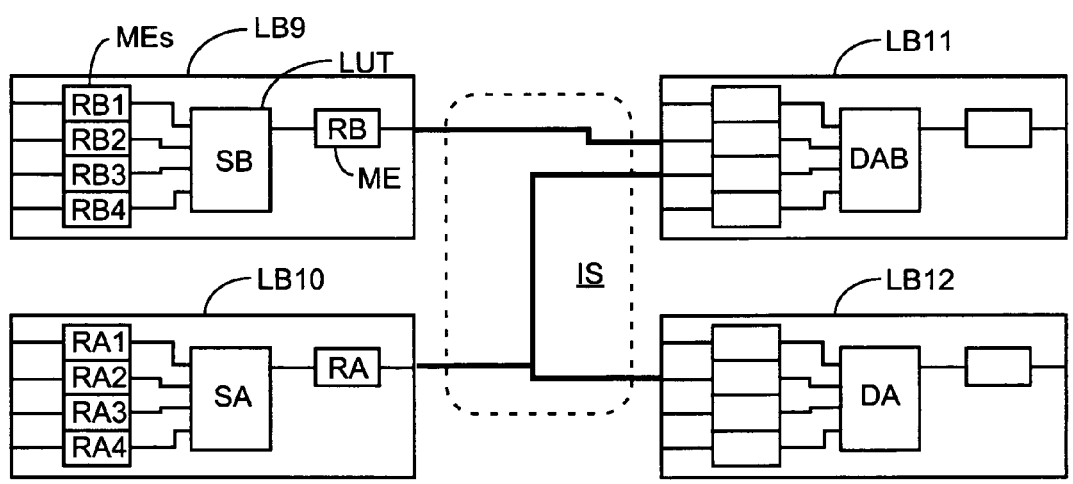
FIG. 9 illustrates one way in which the exemplary user circuit of FIG. 6 can be implemented in a PLD that includes the logic block shown in FIG. 5.

FIG. 9 illustrates one way in which the exemplary user circuit of FIG. 6 can be implemented in a PLD logic block that includes a multi-bit input register as well as a single-bit output register. Each logic block LB9-LB12 in FIG. 9 includes a multi-bit input register MEs (as in FIGS. 7 and 8) followed by a lookup table LUT and a single-bit output register ME (as in FIG. 6). Source circuits SA, SB are again each implemented in a single LUT, which can be the same, for example, as the LUT in FIG. 6. Circuit SA is implemented in the LUT in logic block LB10 and circuit SB is implemented in the LUT in logic block LB9. Destination circuits DA and DAB are implemented in the LUTs in logic blocks LB12 and LB11, respectively.

Registers RA and RB are also included in logic blocks LB10 and LB9, respectively, in the output memory elements included in these logic blocks. In addition, each logic block LB10, LB9 includes four input memory elements MEs in which registers RA1-RA4 and RB1-RB4 are respectively implemented.

Note that the implementation of FIG. 9 is not logically equivalent to the implementations of FIGS. 6-8. The addition of a second memory element to each signal path through the logic block (i.e., from each data input terminal to the data output terminal of each logic block) means that an additional clock cycle delay has been added. However, this implementation might be preferred for some user circuits, e.g., for heavily pipelined designs.

Figure 10:
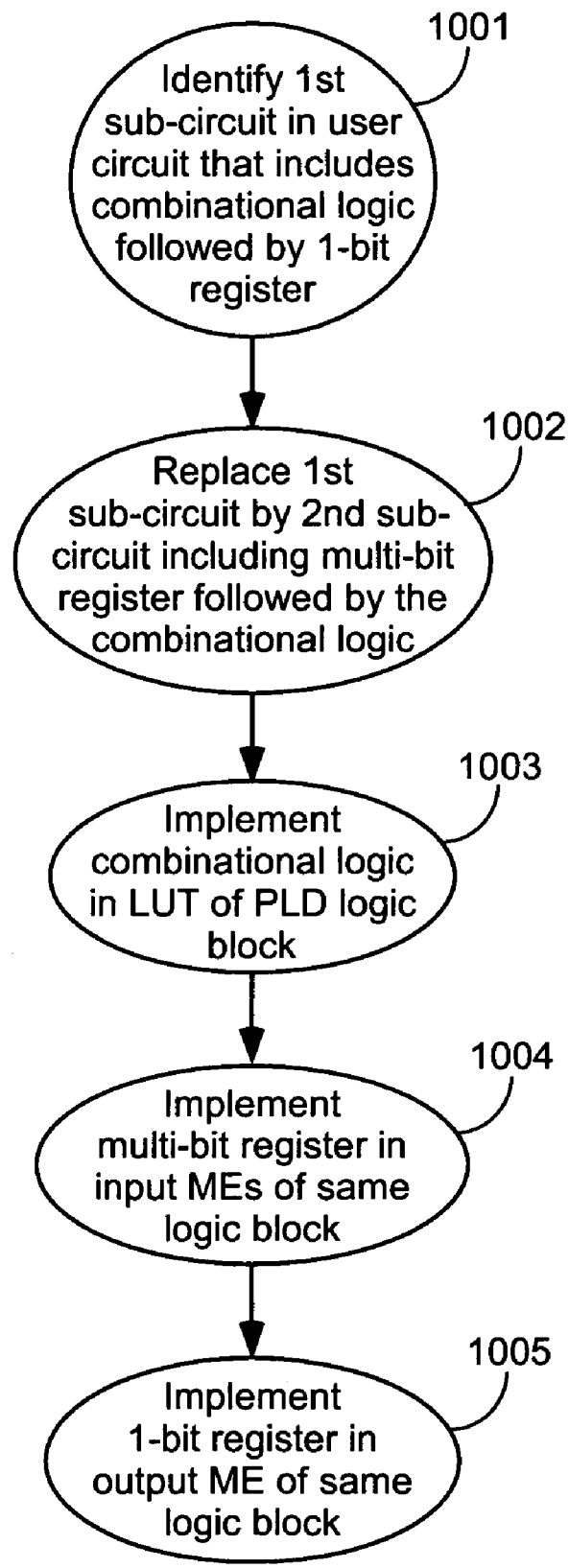
FIG. 10 illustrates the steps of a method of modifying a user circuit in a PLD to reduce power consumption.

FIG. 10 illustrates the steps of a method of modifying a user circuit in a PLD to reduce power consumption. In some embodiments, the PLD is an FPGA. In some embodiments, the PLD is another type of programmable logic device.

In step 1001, a first sub-circuit is identified in the user circuit. The first sub-circuit includes combinational logic and a first single-bit register coupled in series. The combinational logic precedes the first single-bit register and provides a single output signal to the first single-bit register.

In step 1002, the first sub-circuit is replaced by a second sub-circuit. The second sub-circuit includes a multi-bit register and combinational logic, where the combinational logic is the same as the combinational logic in the first sub-circuit. The multi-bit register precedes the combinational logic and provides two or more registered signals to the combinational logic.

In some embodiments, the PLD is made up of programmable logic blocks, each of which includes a LUT. Optional steps 1003-1005 can be applied, for example, to one such embodiment.

In step 1003, the combinational logic is implemented in a LUT included in a programmable logic block of the PLD. In step 1004, the multi-bit register of the second sub-circuit is implemented in two or more input memory elements in the same programmable logic block. Each of the input memory elements provides a data input signal to the LUT. Steps 1003-1004 can be applied, for example, to the circuits illustrated in FIGS. 4-5.

In some embodiments, the second sub-circuit includes a second single-bit register that registers an output signal from the combinational logic, while each programmable logic block also includes an output memory element. Optional step 1005 applies to one such embodiment. In step 1005, the second single-bit register is implemented in the output memory element of the same programmable logic block used in steps 103 and 1004. Step 1005 can be applied, for example, to the circuit illustrated in FIG. 5.

Note that step 1005 alters the logical function of the circuit by inserting an additional register in the signal path. In some embodiments, another register on the signal path is removed to compensate for the additional clock cycle of delay. In other embodiments, the added pipelining is a desirable addition to the circuit.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

Those having skill in the relevant arts of the invention will now perceive various modifications and additions that can be made as a result of the disclosure herein. For example, the above text describes the structures and methods of the invention in the context of programmable logic devices (PLDs) such as field programmable gate arrays (FPGAs). However, the structures of the invention can also be implemented in other PLDs.

Further, memory elements, input memory elements, output memory elements, registers, input registers, output registers, single-bit registers, multi-bit registers, lookup tables (LUTs), multiplexers, input multiplexers, output multiplexers, LUT multiplexers, memory cells, configuration memory cells, logic blocks, configurable logic blocks (CLBs), interconnect structures, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A method of modifying a user circuit in a programmable logic device (PLD) to reduce power consumption, the method comprising:

identifying within the user circuit a first sub-circuit including combinational logic and a first single-bit register coupled in series, wherein the combinational logic precedes the first single-bit register and provides a single output signal thereto;

replacing the first sub-circuit by a second sub-circuit comprising a multi-bit register and the combinational logic coupled in series, wherein the multi-bit register precedes the combinational logic and provides a plurality of registered signals thereto;

implementing the combinational logic in a lookup table (LUT) included in a programmable logic block of the PLD;

implementing the multi-bit register in a plurality of input memory elements in the programmable logic block, each of the input memory elements providing a data input signal to the LUT; and outputting the user circuit for implementation in the PLD.

2. The method of claim 1, wherein the PLD is a field programmable gate array (FPGA).

3. The method of claim 1, wherein the second sub-circuit further comprises a second single-bit register that registers an output signal from the combinational logic, the second single-bit register providing an output signal for the second sub-circuit, the method further comprising:

implementing the second single-bit register in an output memory element in the programmable logic block.

4. The method of claim 3, wherein the PLD is a field programmable gate array (FPGA).

5. The method of claim 3, wherein the input memory elements and the output memory element are all clocked by a single clock signal.

6. An article of manufacture, comprising:

a computer-readable storage medium comprising computer-executable code for modifying a user circuit in a programmable logic device (PLD) to reduce power consumption, the medium comprising:

code for identifying within the user circuit a first sub-circuit including combinational logic and a first single-bit register coupled in series, wherein the combinational logic precedes the first single-bit register and provides a single output signal thereto;

code for replacing the first sub-circuit by a second sub-circuit comprising a multi-bit register and the combinational logic coupled in series, wherein the multi-bit register precedes the combinational logic and provides a plurality of registered signals thereto;

code for implementing the combinational logic in a lookup table (LUT) included in a programmable logic block of the PLD;

code for implementing the multi-bit register in a plurality of input memory elements in the programmable logic block, each of the input memory elements providing a data input signal to the LUT; and code for outputting the user circuit for implementation in the PLD.

7. The medium of claim 6, wherein the PLD is a field programmable gate array (FPGA).

8. The medium of claim 6, wherein the second sub-circuit further comprises a second single-bit register that registers an output signal from the combinational logic, the second single-bit register providing an output signal for the second sub-circuit, the medium further comprising:

code for implementing the second single-bit register in an output memory element in the programmable logic block.

9. The medium of claim 8, wherein the PLD is a field programmable gate array (FPGA).

10. The medium of claim 8, wherein the input memory elements and the output memory element are all clocked by a single clock signal.

11. A computer system for modifying a user circuit in a programmable logic device (PLD) to reduce power consumption, the system comprising:

a first module for identifying within the user circuit a first sub-circuit including combinational logic and a first single-bit register coupled in series, wherein the combinational logic precedes the first single-bit register and provides a single output signal thereto;

a second module for replacing the first sub-circuit by a second sub-circuit comprising a multi-bit register and the combinational logic coupled in series, wherein the multi-bit register precedes the combinational logic and provides a plurality of registered signals thereto;

a third module for implementing the combinational logic in a lookup table (LUT) included in a programmable logic block of the PLD;

a fourth module for implementing the multi-bit register in a plurality of input memory elements in the programmable logic block, each of the input memory elements providing a data input signal to the LUT; and a fifth module for outputting the user circuit for implementation in the PLD, wherein the first, second, third, fourth, and fifth modules comprise modules stored on the computer system.

12. The system of claim 11, wherein the PLD is a field programmable gate array (FPGA).

13. The system of claim 11, wherein the second sub-circuit further comprises a second single-bit register that registers an output signal from the combinational logic, the second single-bit register providing an output signal for the second sub-circuit, the system further comprising:

a sixth module stored on the computer system, the sixth module for implementing the second single-bit register in an output memory element in the programmable logic block.

14. The system of claim 13, wherein the input memory elements and the output memory element are all clocked by a single clock signal.

\* \* \* \* \*